United States Patent [19]

Muraoka et al.

[11] 4,172,005
[45] Oct. 23, 1979

[54] METHOD OF ETCHING A SEMICONDUCTOR SUBSTRATE

[75] Inventors: Hisashi Muraoka, Yokohama; Masafumi Asano, Yokosuka; Taizo Ohashi, Koza, all of Japan

[73] Assignee: Tokyo Shibaura Electric Co., Ltd., Japan

[21] Appl. No.: 843,944

[22] Filed: Oct. 20, 1977

[30] Foreign Application Priority Data

Oct. 21, 1976 [JP] Japan ................. 51-125478

[51] Int. Cl.$^2$ ........................... H01L 21/306
[52] U.S. Cl. ..................... 156/647; 156/648; 156/657; 156/659; 156/667; 252/79.5
[58] Field of Search ............ 156/644, 647, 648, 649, 156/657, 659, 662; 29/580; 357/47, 55, 56; 252/79.5, 79.4

[56] References Cited

U.S. PATENT DOCUMENTS

| | | | |
|---|---|---|---|
| 3,160,539 | 12/1964 | Hall et al. | 156/662 |
| 3,728,179 | 4/1973 | Davidson et al. | 156/647 |
| 3,738,881 | 6/1973 | Erdman et al. | 156/662 X |
| 3,765,969 | 10/1973 | Kragness | 156/648 X |

OTHER PUBLICATIONS

IBM Technical Disclosure Bulletin, vol. 16, No. 7, Dec. 1973, Process for Etching Silicon by Gaind et al., pp. 2291 and 2292.

Primary Examiner—William A. Powell
Attorney, Agent, or Firm—Finnegan, Henderson, Farabow & Garrett

[57] ABSTRACT

A method of etching a semiconductor substrate which comprises the steps of selectively mounting an etching mask on the semiconductor substrate and effecting selective etching by an anisotropic etchant comprising an aqueous solution containing 0.1 to 20% by weight of trihydrocarbon-substituted (hydroxyhydrocarbon-substituted) ammonium hydroxide.

10 Claims, 10 Drawing Figures

METHOD OF ETCHING A SEMICONDUCTOR SUBSTRATE

This invention relates to a method of etching a semiconductor substrate, and more particularly to a method of etching a semiconductor substrate in which an aqueous solution of certain kinds of substituted ammonium hydroxide is applied as an etchant.

The recent tendency goes toward assembling a transistor circuit by large scale integration (LSI). Generally, high density integration is not so widely disseminated for a bipolar type transistor circuit as for an MOS type transistor circuit. The reason is that though operated more quickly than the MOS type transistor, the bipolar type transistor needs a special construction to insulate the constituent elements from each other in integration and consumes a considerably large amount of power. With the bipolar transistor circuit, decrease of power consumptiion has been effected by improvements on said circuit, and insulation of the constituent elements from each other has been undertaken by development of various techniques. The insulation techniques proposed to date include the type which applies anisotropic etching to, for example, a silicon semiconductor substrate. In brief, this technique is characterized by utilizing the different rates at which the respective planes of a single crystal constituting a semiconductor substrate are etched or etching proceeds in various directions and etching off the prescribed portions of the semiconductor substrate thereby retaining those portions of the semiconductor substrate, in which desired semiconductor regions are to be formed, in a state physically separated from each other.

The prior art etchant used in the above-mentioned anisotropic etching includes solutions of, for example, potassium hydroxide, ethylene diamine and hydrazine or these solution mixed with a complexing agent such as pyrocatechol or isopropyl alcohol. These anisotropic etchants are characterized in that etching proceeds far faster in the direction <100> of a silicon single crystal than in the direction <111> thereof. Where, therefore, an etching mask is selectively mounted on a silicon semiconductor substrate whose main plane is constituted by a plane (100), and the selected parts of the semiconductor substrate are brought into contact with the anisotropic etchant, then a plane (111) intersecting the plane (100) at an angle of 54.7° resists etching. Accordingly, those portions of the semiconductor substrate of silicon single crystal on which the etching mask is not mounted are etched eventually with a V-shaped cross section whose lateral sides are formed of the (111) plane. On the other hand, those portions of the semiconductor substrate on which the etching mask is deposited are retained in the form of mutually separated islands each having a trapezoidal cross section.

The conventional anisotropic etchants are all alkaline in nature. However, a semiconductor has generally been treated by an acid solution such as nitric acid or hydrofluoric acid. The reason is that an alkali metal represented by sodium is converted into a movable ion in an oxide layer formed on a semiconductor substrate, not only noticeably decreasing the electric properties of, for example, an MOS device, or plannar type bipolar device, but also deteriorating the properties of a semiconductor device by being readily carried into the oxide layer. For this reason, the field of manufacturing a semiconductor device avoids the application of a compound containing an alkali metal in treating a semiconductor. Therefore, strong demand has been made to develop an anisotropic etchant which is free from an alkali metal, particularly sodium and displays a superior property to the conventional type, as well as a method of effectively separating the constituent elements of a semiconductor device by applying anisotropic etching.

It is accordingly an object of this invention to provide a novel method of etching a semiconductor substrate.

Another object of the invention is to provide a method of etching the semiconductor substrate which does not contaminate the semiconductor substrate by etching, but enables the subsequent treatment of the semiconductor substrate to be carried out easily.

Still another object of the invention is to provide a method of etching a semiconductor substrate for use with a bipolar type integrated circuit, which can increase the integration density of an electric circuit by retaining relatively large unetched portions of the semiconductor substrate after etching the semiconductor substrate through an etching mask.

These and other objects which will be apparent from the following description are attained according to the invention by a method of etching a semiconductor substrate which comprises the steps of selectively forming an etching mask on the semiconductor substrate; and etching those portions of the semiconductor substrate on which the etching mask is not formed by an anisotropic etchant comprising an aqueous solution containing 0.1 to 20% by weight of at least one substituted ammonium hydroxide selected from the group consisting of trihydrocarbon-substituted (hydroxyhydrocarbon-substituted) ammonium hydroxides and tetrahydrocarbon-substituted ammonium hydroxides, thereby retaining those portions of the semiconductor substrate which are covered with the etching mask in the form of mutually physically insulated islands.

This invention can be more fully understood from the following detailed description when taken in conjunction with the accompanying drawings, in which.

Figure 1:
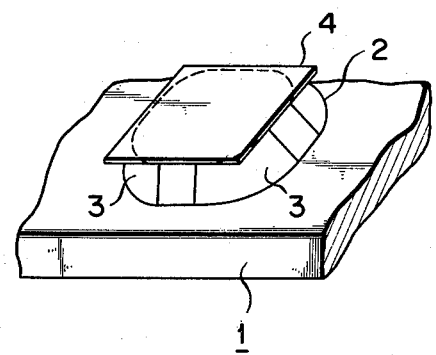
FIG. 1 is an oblique view of a semiconductor substrate when etched through the ordinary etching mask.

An anisotropic etchant used with the method of this invention is an aqueous solution containing trihydrocarbon-substituted (hydroxyhydrocarbon-substituted) ammonium hydroxide and/or tetrahydrocarbon-substituted ammonium hydroxide. These substituted ammonium hydroxides may be expressed by the following general formulas respectively:

Throughout the above formulas, $R^1$, $R^2$, $R^3$, $R^4$ and $R^5$ denote independently hydrocarbon radicals. Generally, $R^1$, $R^2$, $R^3$ and $R^5$ are alkyl radicals, and $R^4$ is an alkylene radical, each of these radicals having 1 to 18 carbon atoms. One or two of these radicals $R^1$, $R^2$, $R^3$, $R^4$ and $R^5$ may be aromatic hydrocarbon radicals such as a phenyl radical. $R^1$, $R^2$, $R^3$ and $R^5$ are preferred to denote alkyl radicals having 1 to 4 carbon atoms, and $R^4$ to represent an alkylene radical having 2 to 4 carbon atoms in consideration of the cost and etching capacity of an anisotropic etchant containing these radicals and the ease of etching operations.

Preferred types of compound expressed by the above-mentioned structural formula (I) include
trimethyl(2-hydroxyethyl)ammonium hydroxide,
triethyl(2-hydroxyethyl)ammonium hydroxide,
tripropyl(2-hydroxyethyl)ammonium hydroxide,
tributyl(2-hydroxyethyl)ammonium hydroxide,
dimethylethyl(2-hydroxyethyl)ammonium hydroxide,
trimethyl(3-hydroxypropyl)ammonium hydroxide,
trimethyl(3-hydroxybutyl)ammonium hydroxide, and
trimethyl(4-hydroxybutyl)ammonium hydroxide.

Particularly preferred are trimethyl(2-hydroxyethyl)ammonium hydroxide,
triethyl(2-hydroxyethyl)ammonium hydroxide, and
trimethyl(3-hydroxypropyl)ammonium hydroxide.

Examples of the compounds expressed by the aforesaid structural formula (II) includes tetramethylammonium hydroxide, tetraethylammonium hydroxide, tetrapropylammonium hydroxide, tetrabutylammonium hydroxide, triethylmonooctylammonium hydroxide, and tributylmonoethylammonium hydroxide. Preferred are tetramethylammonium hydroxide, tetraethylammonium hydroxide, tetrapropylammonium hydroxide and tetrabutylammonium hydroxide with the former two being most preferred. Tetramethylammonium hydroxide is superior to tetraethylammonium hydroxide in respect to the etching rate. Since, however, the former slightly evolves odors at high temperature, application of the latter which does not give forth odors even at high temperature is preferred from the standpoint of saving a work site from environmental pollution.

The substituted ammonium hydroxides expressed by the structural formulas (I) and (II) all have high basicity, and are free from a contaminant such as an alkali metal like sodium or a heavy metal like copper or gold whose inclusion should be avoided with utmost care. Further, the substituted ammonium hydroxides are readily soluble in water and are easily removed by water washing. Even when said hydroxides happen to remain on the surface of a semiconductor substrate, they are decomposed into harmless trialkylamine and alcohol at a temperature of about 100° to about 130° C., facilitating the subsequent treatment of a semiconductor substrate.

An aqueous solution of the substituted ammonium hydroxides expressed by the structural formulas (I) and (II) generally has a capacity of removing organic matter like oils and also inorganic matter such as alkali metals and aluminum, which may be deposited on a semiconductor substrate. The above-mentioned aqueous solution has the further advantage of rendering the surface of a silicon semiconductor and that of a silicon oxide layer hydrophilic, thereby admitting of easy water washing after treatment of a semiconductor substrate.

The aqueous anisotropic etchant solution used with the method of this invention contains 0.1 to 20% by weight, preferably 0.5 to 5% by weight of at least one kind selected from the group consisting of the substituted ammonium hydroxides expressed by the structural formulas (I) and (II). The anisotropic etchant solution of this invention has a unique anisotropic etching characteristic of selectively etching the (100) plane of a silicon single crystal constituting a semiconductor substrate or effecting etching selectively in the $<100>$ direction of said crystal, but conversely carrying out little etching with respect to the (111) plane or $<111>$ direction of said crystal. Said anisotropic etchant solution does not substantially etch a silicon oxide or silicon nitride layer generally used as an etching mask.

According to this invention, an etching mask having the prescribed form is selectively formed on the surface of a semiconductor substrate of silicon single crystal whose main plane is constituted by the (100) plane. The manner in which the etching mask is formed will be well known to those skilled in the art. In practice, a silicon oxide or silicon nitride film mounted entirely on a semiconductor substrate is originally selectively etched by photoetching, retaining certain portions of said film having the prescribed form and removing the remainder to obtain an etching mask of a desired pattern or form.

The respective retained portions of the silicon nitride or silicon oxide film (hereinafter simply referred to as "etching masks") generally have a square or rectangular form, namely, a substantially rectangular parallelogram, each side of which extends in the $<100>$ direction of the silicon single crystal substrate.

When the silicon semiconductor substrate now provided with the above-mentioned square or rectangular silicon nitride or silicon oxide etching mask is dipped in the anisotropic etchant solution of this invention, then those portions of the silicon semiconductor substrate which are covered with the silicon nitride or silicon oxide mask (which resist etching, as previously described, by the present anisotropic etchant solution) are not etched, but only the exposed portions of said substrate are etched. At this time, the (111) plane of the silicon single crystal intersecting the (100) plane thereof at an angle of 54.7° is not substantially etched by the present anisotropic etchant solution, as previously mentioned. Eventually, therefore, the exposed portions of the silicon semiconductor substrate are each etched eventually with a V-shaped cross section whose lateral walls are constituted by the (111) plane. On the other hand, those portions of the silicon semiconductor substrate which are covered with the etching masks are left intact in the form of mutually separated islands each having a trapezoidal cross section. The prescribed semiconductor regions are formed in these islands, thereby providing an LSI circuit device.

Figure 2A:
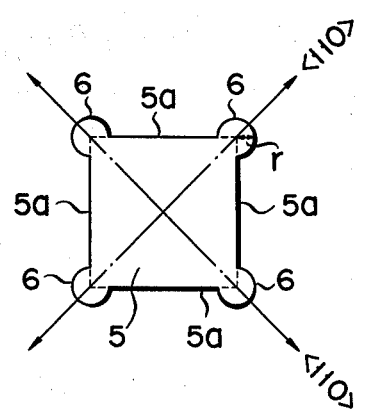
FIGS. 2A and 2B are plan views of a special etching mask used with this invention.
Figure 2B:
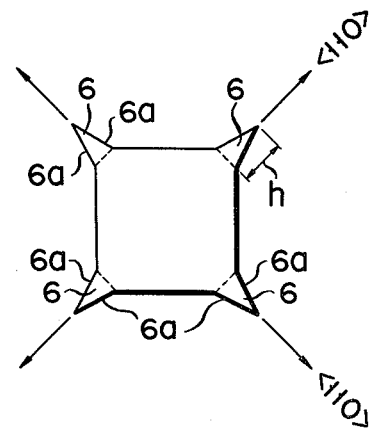

The anisotropic etchant solution of this invention carries out etching at different speeds according to the concentration. For instance, an anisotropic etchant solution containing 10% by weight of trimethyl(2-hydroxyethyl)ammonium hydroxide etches the (100) plane of the silicon single crystal at the rate of 1 $\mu$/min. at 90° C. A similar solution containing 0.5% by weight of trimethyl(2-hydroxyethyl)ammonium hydroxide etches said (100) plane at the rate of 0.4 $\mu$/min. at 90° C.

Where the above-mentioned rectangular parallelogram etching masks are mounted on the silicon semiconductor substrate whose main plane is constituted by the (100) plane, and said substrate is etched by the present anisotropic etchant solution, then it often happens that as etching proceeds, not only the (111) plane, but also the (110) plane etc. appear in those portions of the silicon semiconductor substrate which correspond to the four corners of each rectangular parallelogram etching mask. The (110) plane is etched to a certain extent by the anisotropic etchant solution, though at a slower rate than the (111) plane. As the result, the nonetched portion or island 2 of the silicon semiconductor substrate on which the rectangular parallelogram etching mask 4 is mounted has the corners 3 rounded by etching as seen from FIG. 1. Thus, the effective area of the island 2 decreases by the rounded corner portions. According to the preferred embodiment of this invention, therefore, the four corners of each rectangular parallelogram etching mask are provided with integral projections 6 (FIGS. 2A and 2B) having such an area as can compensate for the loss of those portions of the silicon semiconductor substrate corresponding to the four corners of the rectangular parrallelogram etching mask which are probably etched off, as described above, by the anisotropic etchant solution. The integral projections 6 are arranged in symmetric relationship with respect to the axes pointing to the <110> direction of the silicon single crystal and passing through the respective corners of the rectangular parallelogram etching mask. The shape of the etching mask according to this invention obviously varies with the etching conditions (FIGS. 2A and 2B set forth the typical examples of said shape). Referring to FIGS. 2A and 2B, referential numeral 5 denotes an etching mask body whose four sides 5a can define a rectangular parallelogram. Referential numeral 6 represents the integral projections formed in the four corners of said rectangular parallelogram.

The size of the integral projections 6 of the rectangular parallelogram etching mask whose shape is shown in FIGS. 2A and 2B can be determined by the required depth to which the silicon semiconductor substrate is etched by the anisotropic etchant solution of this invention. Referring to FIG. 2A, the projection 6 has a notched circular form which is centered at the intersection of the imaginary extensions of the respective sides 5a of the rectangular parallelogram etching mask 5 and whose diameter r corresponds to the required depth of etching. Referring to FIG. 2B, the projection 6 has a shape of an isosceles triangle whose base is constituted by a line connecting the intersections between the respective sides 6a of said projections 6 and the four sides 5a of the original rectangular parallelogram etching mask 5 and whose height h is made equal to half the required depth of etching.

Figure 3:
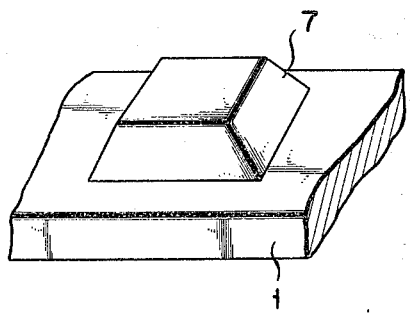
FIG. 3 is an oblique view of a semiconductor substrate when etched through the special etching mask used with the invention.

Those skilled in the art will easily select the shape of the etching mask according to the conditions of etching. Application of the above-mentioned special etching mask can provide, as shown in FIG. 3, an island 7 whose corners are not rounded.

There will now be described by reference to FIGS. 4A to 4E the method of manufacturing the prescribed bipolar type integrated circuit device. Throughout the figures, the same parts are denoted by the same numerals.

Figure 4A:
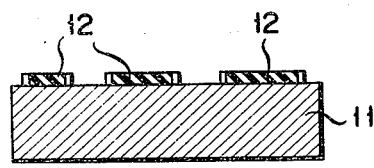
FIGS. 4A to 4E show the sequential steps of one embodiment of the invention.
Figure 4B:
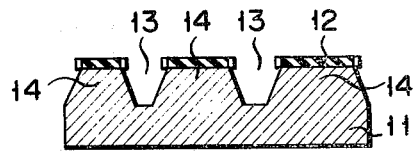
Figure 4B:
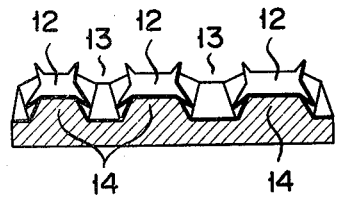

Referring to FIG. 4A, there is provided a silicon semiconductor substrate 11 which has the prescribed resistance and conductivity type and whose upper surface is constituted by a (100) plane. Silicon nitride etching film are formed on the upper surface of the substrate 11 by chemical vapor deposition. The prescribed portions of the nitride film are removed by the photoetching to obtain silicon nitride etching mask 12 having the prescribed shape (FIG. 2B) to expose part of the surface of the silicon semiconductor substrate 11. The exposed portions of the silicon semiconductor substrate 11 are etched 2 minutes by an aqueous solution which contains 1% by weight of trimethyl(2-hydroxyethyl)ammonium hydroxide and is kept at a temperature of 90° C. The exposed etched portions of the substrate 11 are each made into an inverted trapezoidal groove 13 whose cross section is shown in FIG. 4B and whose oblique view is given in FIG. 4B. Those portions 14 of the substrate 11 which are covered with the etching masks 12 are retained in the form of mutually separated trapezoidal islands.

Figure 4C:
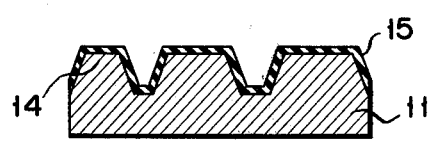
Figure 4D:
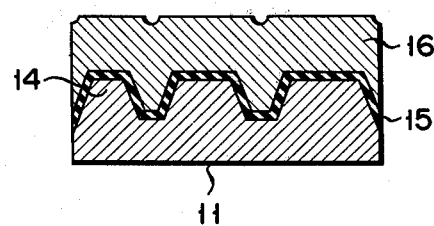
Figure 4E:
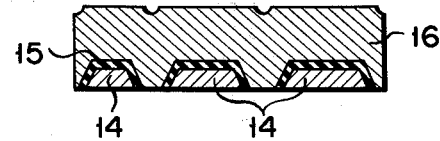

The etching masks 12 are removed to expose the whole surface of the substrate 11. A silicon oxide layer 15 is deposited all over said surface (FIG. 4C). A polysilicon layer 16 is mounted on said silicon oxide layer 15 by chemical vapor deposition (FIG. 4D). Thereafter, lapping is carried out from the backside of the semiconductor substrate 11 up to the bottom of the inverted trapezoidal grooves 13 (FIG. 4E). The prescribed semiconductor regions are formed in the islands 14 by the customary process (not shown), thereby providing the bipolar type integrated circuit.

The above-mentioned etching process of this invention has been found to increase the density of integration by about 20% over a semiconductor substrate prepared by the conventional etching method.

What we claim is:

1. A method of etching a semiconductor substrate which comprises the steps of selectively forming etching masks on the semiconductor substrate; and etching those portions of the semiconductor substrate which are not covered with the etching masks by an anisotropic etchant formed of an aqueous solution containing 0.1 to 20% by weight of at least one substituted ammonium hydroxide selected from the group consisting of trihydrocarbon-substituted (hydroxyhydrocarbon-substituted) ammonium hydroxides, thereby retaining the nonexposed portions of the semiconductor substrate in the form of mutually physically insulated islands.

2. The method according to claim 1, wherein the semi-conductor substrate is formed of a silicon single crystal.

3. The method according to claim 2, wherein that surface of the semiconductor substrate on which the etching mask is formed is constituted by the (100) plane of the silicon single crystal.

4. The method according to claim 3, wherein the etching mask has a rectangular parallelogram body whose sides all point to the direction <100> of the silicon single crystal.

5. The method according to claim 4, wherein the four corners of the rectangular parallelogram etching mask are provided with projections which are arranged in symmetric relationship with respect to the axes extending in the direction <110> of the silicon single crystal, and whose areas are each sufficiently large to cause the surfaces of those portions of the semiconductor substrate which are left after etching by the anisotropic etching solution to have a rectangular parallelogram.

6. The method according to claim 1, wherein the trihydrocarbon-substituted (hydroxyhydrocarbon-substituted) ammonium hydroxide is expressed by the structural formula:

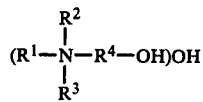

wherein $R^1$, $R^2$ and $R^3$ are independently alkyl radicals each having 1 to 18 carbon atoms, and $R^4$ is an alkylene radical having 1 to 18 carbon atoms.

7. The method according to claim 6, wherein $R^1$, $R^2$ and $R^3$ are independently alkyl radicals each having 1 to 4 carbon atoms, and $R^4$ is an alkylene radical having 2 to 4 carbon atoms.

8. The method according to claim 7, wherein the trihydrocarbon-substituted (hydroxyhydrocarbon-substituted) ammonium hydroxide is trimethyl(2-hydroxyethyl)ammonium hydroxide, triethyl(2-hydroxyethyl)ammonium hydroxide, or trimethyl(3-hydroxypropyl)ammonium hydroxide.

9. The method according to claim 5, wherein the projections provided in the four corners of the rectangular parallelogram etching mask are each made into the form of an isosceles triangle.

10. The method according to claim 5, wherein the projections in the four corners of the rectangular parallelogram etching mask are each made into the form of a notched circle.

* * * * *